United States Patent
Lee

(10) Patent No.: US 9,318,398 B2
(45) Date of Patent: Apr. 19, 2016

(54) CHIP-ON-FILM PACKAGE AND DISPLAY DEVICE HAVING THE SAME

(71) Applicant: Samsung Display Co., Ltd., Yongin, Gyeonggi-Do (KR)

(72) Inventor: Hee Kwon Lee, Hwaseong-si (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 93 days.

(21) Appl. No.: 14/062,580

(22) Filed: Oct. 24, 2013

(65) Prior Publication Data

US 2014/0319523 A1    Oct. 30, 2014

(30) Foreign Application Priority Data

Apr. 29, 2013  (KR) .......................... 10-2013-0047538

(51) Int. Cl.
*H01L 29/10* (2006.01)
*H01L 21/66* (2006.01)
*H01L 27/32* (2006.01)

(52) U.S. Cl.
CPC ............ *H01L 22/34* (2013.01); *H01L 27/3276* (2013.01)

(58) Field of Classification Search
CPC ....... H01L 23/488; H01L 23/34; H01L 23/14; H01L 22/34
USPC ........................................................ 257/48
See application file for complete search history.

(56) References Cited

U.S. PATENT DOCUMENTS

| 2010/0156857 | A1* | 6/2010 | Nozaki .......................... 345/204 |
| 2011/0005090 | A1* | 1/2011 | Lee et al. ....................... 33/1 PT |
| 2011/0205312 | A1* | 8/2011 | Miyata .................. B41J 2/14233 347/70 |
| 2012/0139829 | A1* | 6/2012 | Anno et al. .................... 345/156 |
| 2012/0256720 | A1* | 10/2012 | Byun et al. ........................ 338/2 |
| 2012/0293960 | A1* | 11/2012 | Takashima et al. ............ 361/707 |
| 2013/0127606 | A1* | 5/2013 | Chang .................... G09G 3/006 340/384.7 |
| 2013/0133435 | A1* | 5/2013 | Muramatsu .............. G01B 1/00 73/799 |
| 2014/0312486 | A1* | 10/2014 | Lee ............................... 257/713 |

FOREIGN PATENT DOCUMENTS

| KR | 1020060036623 | 5/2006 |
| KR | 1020120049733 | 5/2012 |

* cited by examiner

*Primary Examiner* — Matthew Landau
*Assistant Examiner* — Igwe U Anya
(74) *Attorney, Agent, or Firm* — Robert E. Bushnell, Esq.

(57) ABSTRACT

A chip-on-film package includes a base film, a test line, and an integrated circuit chip. The base film includes a bent area in which a bending occurs. The test line is disposed on the base film, and at least a portion of the test line is overlapped with the bent area. The integrated circuit chip is disposed on the base film and includes a first terminal and a second terminal. The first terminal is connected to one end of the test line to output a first signal and the second terminal is connected to the other end of the test line to receive a second signal. The integrated circuit chip detects whether a crack occurs in the bent area based on a difference value in signal characteristics.

9 Claims, 5 Drawing Sheets

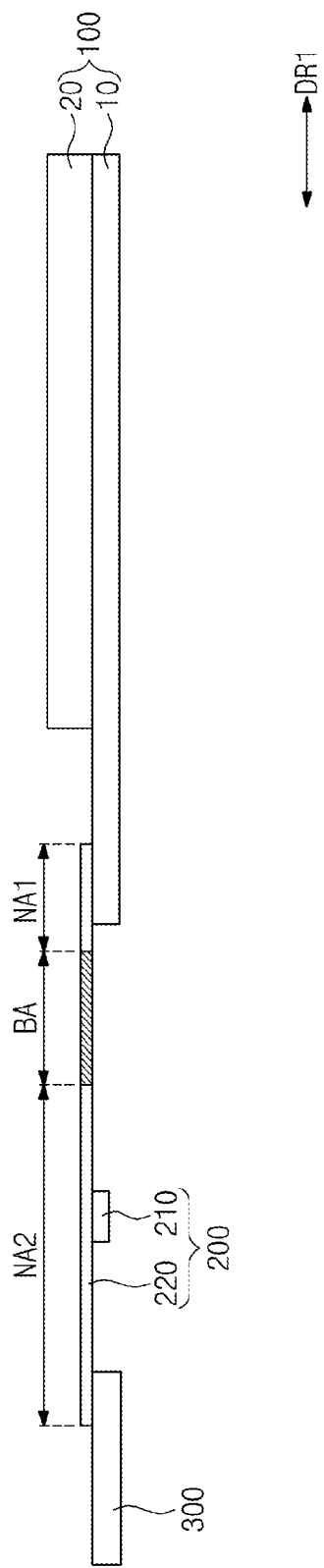

CHIP-ON-FILM PACKAGE AND DISPLAY DEVICE HAVING THE SAME

CLAIM OF PRIORITY

This U.S. non-provisional patent application claims priority under 35 U.S.C. §119 of Korean Patent Application No. 10-2013-0047538, filed on Apr. 29, 2013, the contents of which are hereby incorporated by reference.

BACKGROUND OF THE INVENTION

1. Field of Disclosure

The present disclosure relates to a chip-on-film package and a display device having the same. More particularly, the present disclosure relates to a chip-on-film package having an improved grounding function and a display device having the chip-on-film package.

2. Description of the Related Art

In general, a display device includes a display panel, a printed circuit board that drives the display panel, and a tape carrier package or a chip-on-film package that electrically connects the printed circuit board to the display panel.

The chip-on-film package, in which a semiconductor chip is packaged on a base film, is gradually widely used in various fields since it has advantages, such as small heat expansion coefficient, superior flexibility, thin thickness, ultra fine pitch, etc., when compared to the tape carrier package.

One end of the chip-on-film package is connected to an upper portion of the display panel and disposed at a lower portion of the display panel after being bent. When the radius of curvature of the bent area of the chip-on film package exceeds an allowable curvature radius or a bending stress is produced at the bent area, a crack occurs in the bent area or an area adjacent to the bent area. When the crack occurs in the chip-on-film package, defects occur in signal lines disposed on the chip-on-film package or in a driving condition of the chip-on-film package, thereby causing deterioration in a display quality of the display device.

SUMMARY OF THE INVENTION

The present disclosure provides a chip-on-film package capable of detecting a crack.

The present disclosure provides a display device having the chip-on-film package.

Embodiments of the inventive concept provide a chip-on-film package including a base film, a test line, and an integrated circuit chip. The base film includes a bent area in which a bending occurs.

The test line is disposed on the base film, and at least a portion of the test line is overlapped with the bent area. The portion of the test line overlapped with the bent area is configured to include at least two straight lines.

The integrated circuit chip is disposed on the base film and includes a first terminal connected to one end of the test line to output a first signal and a second terminal connected to the other end of the test line to receive a second signal. The integrated circuit chip detects whether a crack occurs in the bent area based on a difference value in signal characteristics between the first signal and the second signal.

The difference value in signal characteristics includes at least one of a time delay difference value, a phase difference value, or a resistance difference value between the first signal and the second signal.

According to embodiment, the test line includes a detecting pattern that has an overlap area with the bent area, which is greater than the overlap area between two straight lines respectively protruding from the first and second terminals in the first direction and the bent area, and the detecting pattern has a zigzag shape.

Embodiments of the inventive concept provide a display device including a display panel that displays an image, a printed circuit board, and a chip-on-film package. The printed circuit board drives the display panel and the chip-on-film package electrically connects the display panel and the printed circuit board.

The chip-on-film package provides a result signal indicating whether the crack occurs in the bent area to the printed circuit board, and the printed circuit board receives the result signal to control a driving condition of the display panel to be different from a driving condition of the display panel prior to receiving the result signal. The printed circuit board controls the display panel to be in an OFF state when the crack occurs in the bent area.

According to the above, the display device detects the crack generated in the bent area of the chip-on-film package, and thus a potential defect of the chip-on-film package may be detected in advance. In addition, the crack generated in the chip-on-film package may be instantly detected and the operation of the display panel may be stopped, thereby preventing defect and deterioration in wiring part of the display panel in advance.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 2A is a cross-sectional view taken along a line I-I' of FIG. 1;

DETAILED DESCRIPTION OF THE INVENTION

Figure 1:
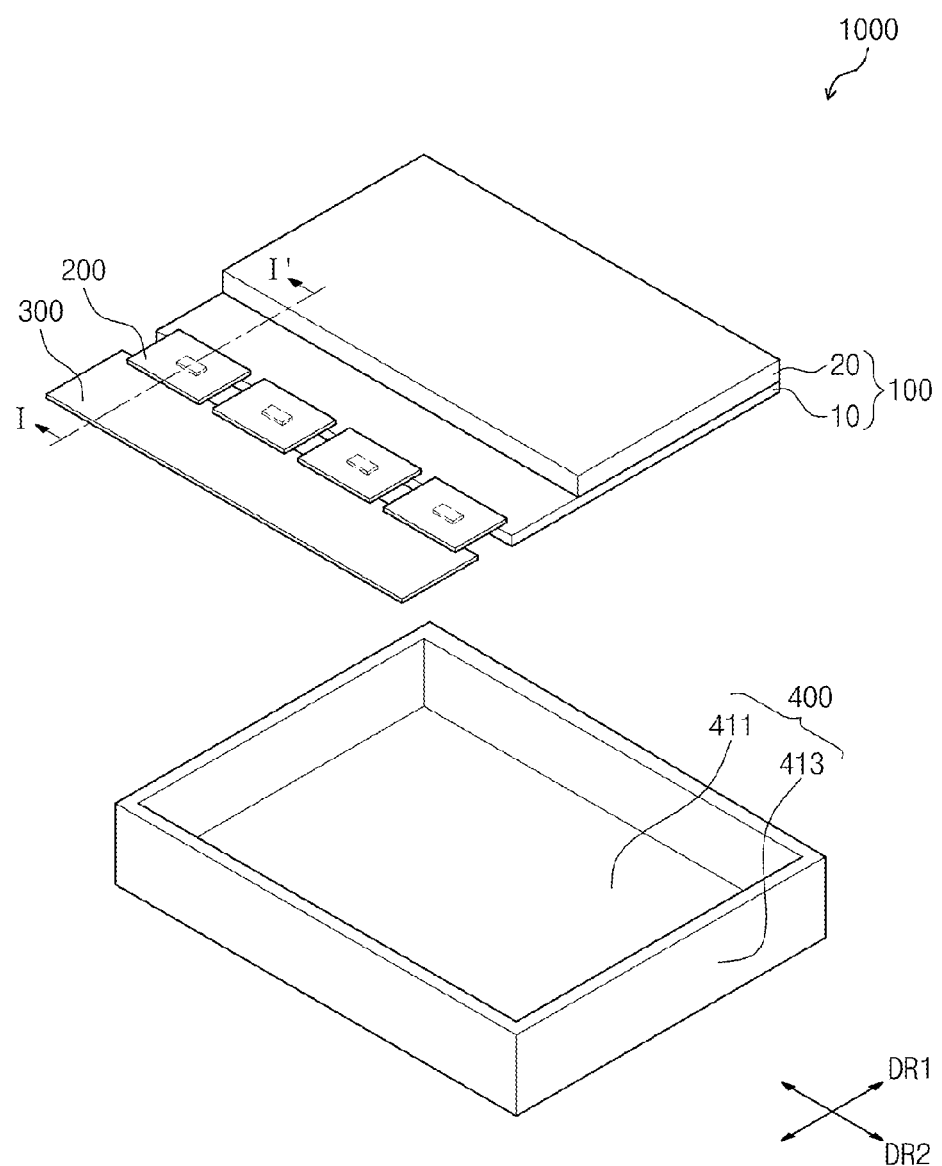
FIG. 1 is an exploded oblique view showing a display device constructed as an embodiment according to the principles of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 2B:
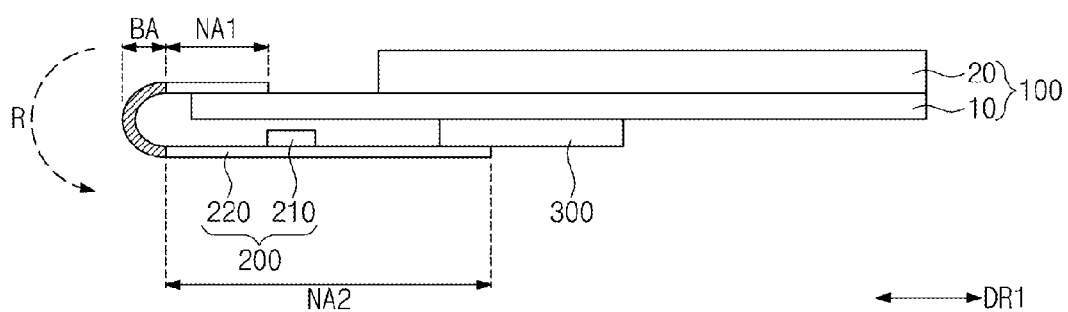
FIG. 2B is a cross-sectional view taken along the line I-I' of FIG. 1 after chip-on-film packages are bent.

FIG. 1 is an exploded oblique view showing a display device 1000 constructed as an embodiment according to the principles of the present invention, FIG. 2A is a cross-sectional view taken along a line I-I' shown in FIG. 1, and FIG. 2B is a cross-sectional view taken along the line I-I' of FIG. 1 after chip-on-film packages are bent along a bending direction R.

Referring to FIGS. 1, 2A, and 2B, the display device 1000 includes a display panel 100, a chip-on-film (hereinafter, referred to as COF) package 200, a printed circuit board 300, and a chassis 400.

The display panel 100 may be an organic light emitting display panel, a liquid crystal display panel, a plasma display panel, an electrophoretic display panel, or an electrowetting display panel. In the present embodiment, the organic light emitting display panel will be described as the display panel 100.

The display panel 100 displays an image. The display panel 100 includes a first substrate 10 and a second substrate 20. The first substrate 10 includes a plurality of pixels arranged in a matrix form in a display area thereof. In addition, the first substrate 10 further includes a gate driver (not shown) and a data driver (not shown) to drive the pixels.

When viewed in a plan view, the first substrate 10 has an area greater than that of the second substrate 20. A pad electrode (not shown) is disposed on an area of the first substrate 10, which is not overlapped with the second substrate 20. The pad electrode (not shown) is electrically connected to the gate driver and the data driver. A signal applied to the pad electrode is applied to the gate driver and the data driver.

The second substrate 20 is coupled to the first substrate 10 to seal pixels, circuits, and wirings, which are formed on the first substrate 10, from an external environment. Although not shown in FIGS. 1, 2A and 2B, the display panel 100 may further include a polarizing film attached to a surface of the second substrate 20 to prevent an external light from being reflected.

The COF package 200 electrically connects the printed circuit board 300 to the display panel 100. The COF package 200 includes a base film (not shown) and an integrated circuit chip 210 disposed on the base film.

One end portion in a first direction DR1 of the COF package 200 is bonded to the pad electrode to be connected to the display panel 100, and the other end portion in the first direction DR1 of the COF package 200 is electrically connected to the printed circuit board 300.

FIG. 1 shows four COF packages arranged in a second direction DR2 substantially perpendicular to the first direction DR1 and spaced apart from each other, but the number of the COF packages should not be limited to four.

The COF package 200 is bent to have a C shape or a rotated U shape and mounted on the display panel 100. In detail, the COF package 200 is extended from an upper surface of the first substrate 10 along a side surface of the first substrate 10 and fixed to a lower surface of first substrate 10 while interposing the printed circuit board 300 therebetween. To this end, the COF package 200 may be flexible.

The printed circuit board 300 drives the display panel 100. The printed circuit board 300 includes a driving board (not shown) and a plurality of circuits (not shown) mounted on the driving board. The printed circuit board 300 is mounted on the lower surface of the first substrate 10 while the COF package 200 is bent and mounted thereon.

The chassis 400 includes a bottom portion 411 and a sidewall portion 413 extended upward from the bottom portion 411. The chassis 400 provides a receiving space and the display panel 100, the COF package 200, and the printed circuit board 300 are accommodated in the receiving space.

Figure 3:
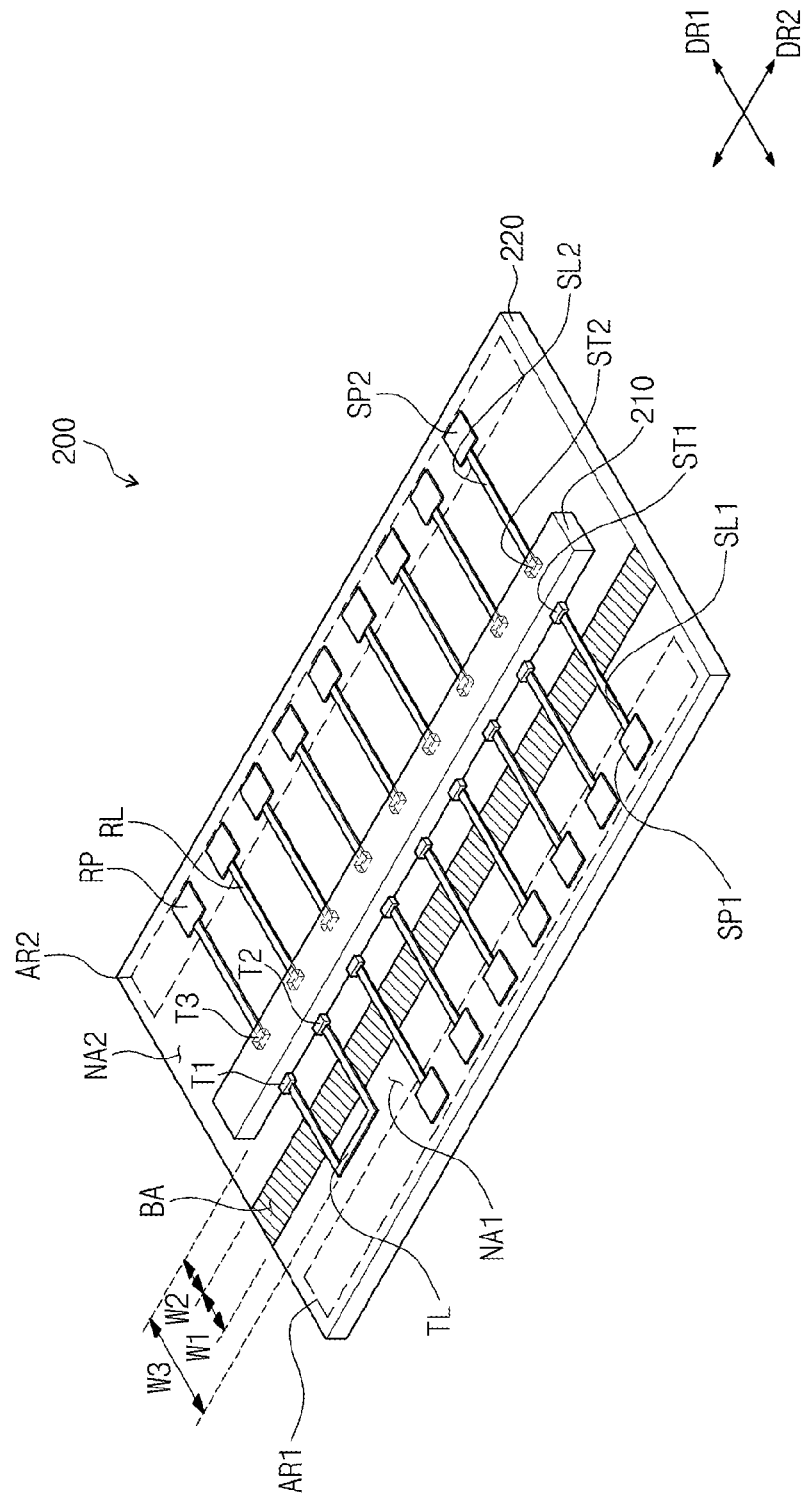
FIG. 3 is an oblique view showing one of the chip-on-film packages shown in FIG. 1.

FIG. 3 is a perspective view showing one COF package 200 of FIG. 1.

Referring to FIGS. 2A, 2B, and 3, the COF package 200 includes the base film 220, the integrated circuit chip 210, and a test line TL.

The COF package 200 includes a bent area BA, a first non-bent area NA1, a second-bent area NA2 when viewed in a plan view.

The bending of the COF package 200 occurs in the bent area BA. The bent area BA has a uniform width in the first direction DR1 and is extended in the second direction DR2.

The bending of the COF package 200 does not occur in the non-bent areas NA1 and 2 even though the COF package 200 is bent. When viewed in a plan view, the non-bent areas NA1 and NA2 correspond to an area of the COF package 200 except for the bent area BA. The first non-bent area NA1 includes a first bonding area AR1 and the second non-bent area NA2 includes a second bonding area AR2. The first bonding area AR1 is bonded to the display panel 100 and the second bonding area AR2 is bonded to the printed circuit board 300. Each of the first bonding area AR1 and the second bonding area AR2 corresponds to the end portion of the COF package 200 in the first direction DR1. Each of the first bonding area AR1 and the second bonding area AR2 is spaced apart from the bent area BA. Meanwhile, the display panel 100 and the printed circuit board 300 are bonded to an upper surface of the COF package 200.

The bent area BA is an area between the first bonding area AR1 and the integrated circuit chip 210 or an area between the second bonding area AR2 and the integrated circuit chip 210. In FIG. 3, the area between the first bonding area AR1 and the integrated circuit chip 210 is shown as the bent area BA.

The base film 220 may be flexible. The base film 220 includes an upper surface which becomes the inner surface of the COF package 200 when the COF package 200 is bent as shown in FIG. 2B and a lower surface facing the upper surface.

The integrated circuit chip 210 is disposed on the upper surface of the base film 220. The integrated circuit chip 210 includes a first terminal T1 and a second terminal T2. The first and second terminals T1 and T2 are spaced apart from each other, and the first and second terminals T1 and T2 output or receive signals. The first and second terminals T1 and T2 are disposed in an outer portion in the first direction DR1 of the integrated circuit chip 210.

The test line TL is disposed on the base film 220 and at least a portion of the test line TL is overlapped with the bent area BA when viewed in a plan view. The test line TL may be formed as one line. One end of the test line TL is connected to the first terminal T1, and the other end of the test line TL is connected to the second terminal T2. The test line TL is disposed to form a closed-loop in cooperation with the integrated circuit chip 210.

When viewed in a plan view, the test line TL is disposed to cross the bent area BA in the first direction DR1. The portion of the test line TL, which is overlapped with the bent area BA, may be two straight lines. Meanwhile, although not shown in figures, the portion of the test line TL, which is overlapped with the bent area BA, may be three or more straight lines.

The test line TL has a length W3 in the first direction DR1, which is larger than a sum of a length W2 in the first direction DR1 between the integrated circuit chip 210 and the bent area BA and a width W1 in the first direction DR1 of the bent area BA, i.e., W3>W1+W2.

The integrated circuit chip 210 outputs a first signal to the first terminal T1 and receives a second signal from the second terminal T2.

The integrated circuit chip 210 detects whether a crack is generated in the bent area BA of the COF package 200 or not on the basis of a difference value in signal characteristics between the first signal and the second signal. The difference value in signal characteristics between the first and second signals may be at least one of a time delay difference value, a phase difference value, or a resistance difference value.

In a case that the difference value in signal characteristics between the first and second signals is smaller than a predetermined reference value, the integrated circuit chip 210 determines that no crack occurs in the COF package 200. Meanwhile, when the difference value in signal characteristics between the first and second signals is greater than the predetermined reference value, the integrated circuit chip 210 determines that the crack occurs in the COF package 200. This may be performed by using a phenomenon that a distortion occurs between the first signal and the second signal when the crack occurs in the bent area BA since at least the portion of the test line TL is overlapped with the bent area BA.

According to the embodiment of the present invention, the display device 1000 detects the crack generated in the bent area BA of the COF package 200, and thus a potential defect of the COF package 200 may be detected in advance.

The COF package 200 further includes a first signal terminal ST1, a second signal terminal ST2, a first signal line SL1, a second signal line SL2, a first signal pad SP1, and a second signal pad SP2.

The first signal terminal ST1 is disposed in one side of the integrated circuit chip 210 adjacent to the first bonding area AR1. The second signal terminal ST2 is disposed in the other side of the integrated circuit chip 210 adjacent to the second bonding area AR2. The first signal line SL1 connects the integrated circuit chip 210 and the first signal pad SP1, and the second signal line SL2 connects the integrated circuit chip 210 and the second signal pad SP2.

The integrated circuit chip 210 receives a driving voltage and a driving signal from the printed circuit board 300 through the second signal pad SP2, the second signal line SL2, and the second signal terminal ST2, which are disposed on the second bonding area AR2. The integrated circuit chip 210 generates a gate signal and a data signal corresponding to the driving voltage and the driving signal and outputs the gate signal and the data signal to the first signal pad SP1 disposed on the first bonding area AR1 through the first signal terminal ST1 and the first signal line SL1. The signals output to the first signal pad SP1 are applied to the display panel 100 that is electrically connected to the first signal pad SP1.

The COF package 200 further includes a third terminal T3, a result line RL, and a result pad RP. The result pad RP is disposed in the second bonding area AR2, and the result line RL connects the third terminal T3 to the result pad RP. The result pad RP is electrically connected to the printed circuit board 300.

The integrated circuit chip 210 provides a result signal indicating whether the crack is generated in the COF package 200 to the third terminal T3. The result signal is applied to the printed circuit board 300 through the third terminal T3, the result line RL, and the result pad RP.

In a cast that the printed circuit board 300 receives the result signal indicating that the COF package 200 is cracked, the printed circuit board 300 controls a driving condition of the display panel 100, which is different from a driving condition of the display panel 100 prior to receiving the result signal. For instance, when the crack is generated in the COF package 200 and the display panel 100 is operated in an ON state before the printed circuit board 300 receives the result signal, the printed circuit board 300 controls the display panel to be turned off after receiving the result signal.

According to the display device 1000 according to the embodiment of the present invention, the crack generated in the COF package 200 may be instantly detected and the operation of the display panel 100 may be stopped, thereby preventing defect and deterioration in wiring part of the display panel 100 in advance.

Although not shown in figures, the COF package 200 may further include a protective layer to cover the upper surface of the base film 220 except for the first bonding area AR1 and the second bonding area AR2. The protective layer protects the integrated circuit chip 210, the test line TL, the first signal line SL1, and the second signal line SL2, which are disposed under the protective layer, from an external environment.

Figure 4:
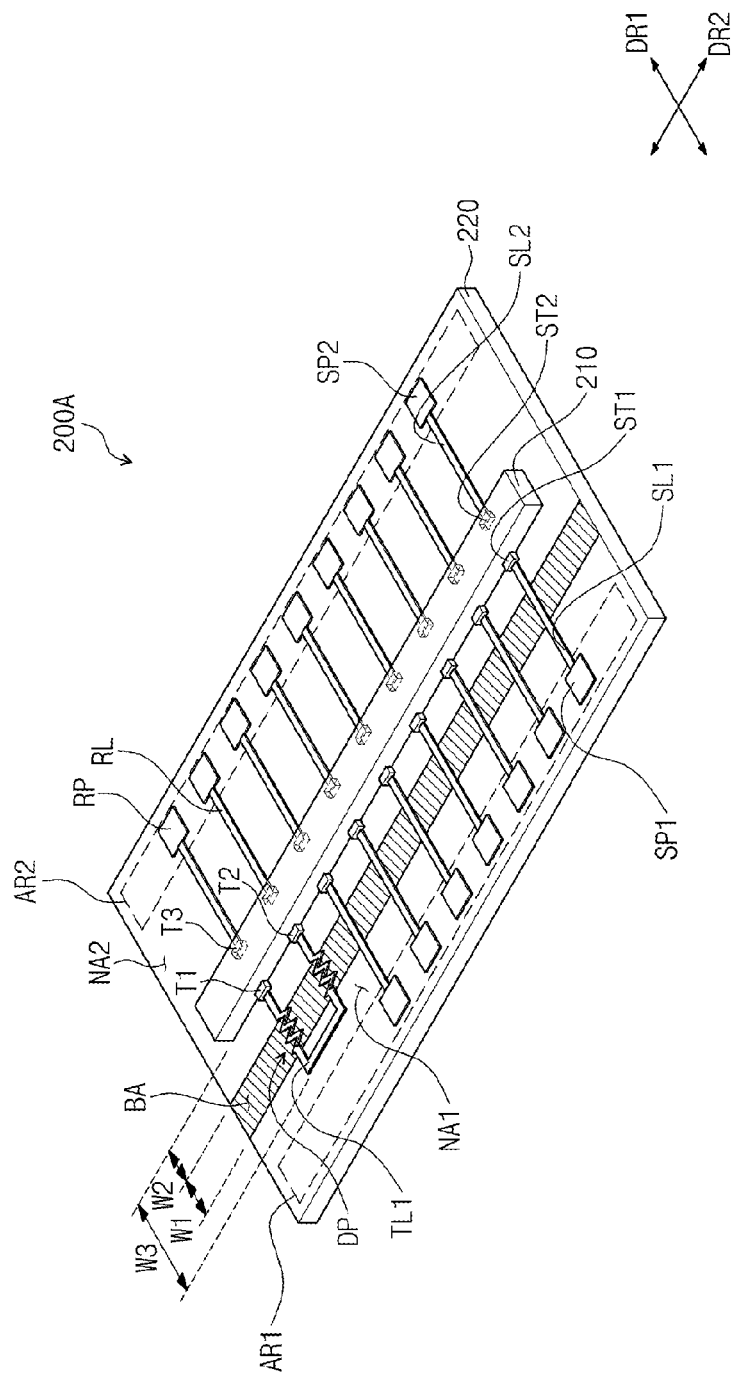
FIG. 4 is an oblique view showing one of chip-on-film packages constructed as another embodiment according to the principles of the present invention.

FIG. 4 is an oblique view showing one COF package 200A according to another embodiment of the present invention.

In the present embodiment, a COF package 200A shown in FIG. 4 has substantially the same structure and function as those of the COF package 200 shown in FIG. 3 except for the test line, and thus the difference in the test line will be mainly described with reference to FIG. 4.

Referring to FIG. 4, a test line TL1 is disposed to cross the bent area BA in the first direction DR1. The test line TL1 includes a detecting pattern DP. The detecting pattern is disposed at an overlap area overlapped the test line TL1 with the bent area BA. The detection pattern DP has a shape having a greater overlap area with the bent area BA than an overlap area overlapped a straight line shape with the bent area BA. The detecting pattern DP is configured to include at least two detecting patterns DP. The detecting pattern DP may have a zigzag shape, but it should not be limited to the zigzag shape. That is, the detecting pattern DP may have various shapes as long as the detecting pattern DP has a shape having a greater overlap area with the bent area BA than an overlap area overlapped a straight line shape with the bent area BA.

A length W3 in the first direction DR1 of the test line TL1 may be greater than a sum of a length W2 in the first direction DR1 between an integrated circuit chip 210 and the bent area BA and a width W1 in the first direction DR1 of the bent area BA, i.e., W3>W1+W2.

According to the COF package 200A of the present embodiment, the overlap area between the test line TL1 and the bent area BA is greater than the overlap area between the test line TL and the bent area BA shown in FIGS. 1 to 3, and thus the crack generated in the bent area BA may be more easily detected.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

What is claimed is:

1. A display device, comprising:
a display panel displaying an image;
a printed circuit board driving the display panel; and
a chip-on-film package electrically connecting the display panel and the printed circuit board, the chip-on-film package comprising:
a base film including a bent area in which bending of the base film occurs;
a test line disposed on the base film, at least a portion of the test line overlapping the bent area; and
an integrated circuit chip disposed on the base film and including a first terminal connected to one end of the test line to output a first signal and a second terminal connected to the other end of the test line to receive a second signal,
the integrated circuit chip determining whether an undesired crack has occurred in the bent area based on a difference in value of signal characteristics between the first signal and the second signal,
wherein the integrated circuit chip provides a result signal indicating whether the undesired crack has occurred in the bent area of the printed circuit board, and the printed circuit board receives the result signal and controls a driving condition of the display panel in correspondence with the received result signal.

2. The display device of claim 1, wherein the printed circuit board controls the display panel to be in an OFF state when the received result signal indicates that the undesired crack has occurred in the bent area.

3. The display device of claim 1, wherein the difference in value of signal characteristics comprises at least one of a time delay difference value, a phase difference value, or a resistance difference value between the first signal and the second signal.

4. The display device of claim 1, wherein the bent area does not overlap the integrated circuit chip, has a uniform width in a first direction, and is extended in a second direction substantially perpendicular to the first direction, and the test line crosses the bent area in the second direction.

5. The display device of claim 4, wherein the test line and the integrated circuit chip form a closed-loop.

6. The display device of claim 5, wherein the portion of the test line that overlaps the bent area comprises at least two straight lines.

7. The display device of claim 6, wherein the test line has a length in the first direction, which is greater than a sum of a distance in the first direction between the integrated circuit chip and the bent area and a width in the first direction of the bent area.

8. The display device of claim 1, wherein the test line comprises a detection pattern, wherein the detection pattern has a shape having a greater overlap area with the bent area than an overlap area overlapped a straight line shape with the bent area.

9. The display device of claim 8, wherein the detecting pattern has a zigzag shape.

* * * * *